(12) United States Patent
Jang

(10) Patent No.: US 11,467,903 B2
(45) Date of Patent: Oct. 11, 2022

(54) MEMORY SYSTEM AND OPERATING METHOD THEREOF

(71) Applicant: SK hynix Inc., Icheon-si (KR)

(72) Inventor: In Jong Jang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/301,847

(22) Filed: Apr. 15, 2021

(65) Prior Publication Data

US 2022/0156144 A1 May 19, 2022

(30) Foreign Application Priority Data

Nov. 19, 2020 (KR) .................. 10-2020-0155418

(51) Int. Cl.
*G06F 11/10* (2006.01)
*G06F 11/30* (2006.01)
*G06F 11/14* (2006.01)
*G06F 11/16* (2006.01)

(52) U.S. Cl.
CPC ...... *G06F 11/1068* (2013.01); *G06F 11/1417* (2013.01); *G06F 11/1658* (2013.01); *G06F 11/3037* (2013.01)

(58) Field of Classification Search
CPC ............. G06F 11/1068; G06F 11/1417; G06F 11/1658; G06F 11/3037
See application file for complete search history.

(56) References Cited

U.S. PATENT DOCUMENTS

| 8,954,649 | B2* | 2/2015 | Biswas | G11C 29/76 |
| | | | | 714/6.13 |
| 9,727,263 | B2* | 8/2017 | Bennett | G06F 11/1471 |
| 2011/0078364 | A1* | 3/2011 | Lee | G06F 12/0246 |
| | | | | 711/E12.001 |
| 2011/0238900 | A1* | 9/2011 | Heo | G06F 9/4403 |
| | | | | 711/E12.008 |

FOREIGN PATENT DOCUMENTS

| JP | 2001504973 | * | 4/2001 | ......... G11C 11/5628 |
| KR | 20130135621 A | * | 12/2013 | .......... G06F 11/1068 |
| KR | 10-1449614 | | 10/2014 | |
| KR | 10-2018-0062158 | | 6/2018 | |

* cited by examiner

*Primary Examiner* — Guy J Lamarre
(74) *Attorney, Agent, or Firm* — Weaver Austin Villeneuve & Sampson LLP

(57) ABSTRACT

Embodiments of the present disclosure provide a memory system and an operating method thereof. A memory system includes a memory device and a memory controller. The memory controller is configured to create a bad memory area replacement table including state information of a bad memory area among a plurality of memory areas, add the state information of one or more runtime bad memory areas to the bad memory area replacement table when one or more runtime bad memory areas occur, and remap, based on the bad memory area replacement table, a bad sub-area included in a target memory area to a normal sub-area included in one of remaining bad memory areas other than the target bad memory area among the bad memory areas added to the bad memory area replacement table.

20 Claims, 15 Drawing Sheets

FIG.9

BAD_TBL

| | MEM_AREA_1 | MEM_AREA_2 | ... | MEM_AREA_K | |
|---|---|---|---|---|---|
| IDX_1 | 0xFFFF | 0xFFFF | ... | 0xFFFF | |
| IDX_2 | 0xFFFF | 0xFFFF | ... | 0xFFFF | |
| IDX_3 | 0xFFFF | 0x01F2 | ... | 0xFFFF | N sub_areas |
| ... | ... | ... | ... | ... | |
| IDX_N-1 | 0x01F2 | 0xFFFF | ... | 0xFFFF | |
| IDX_N | 0x009D | 0x0144 | ... | 0xFFFF | |

(value) == 0xFFFF : bad
(value) != 0xFFFF : normal

FIG.10

BAD_TBL

|  | MEM_AREA_1 | MEM_AREA_2 | ... | MEM_AREA_K | MEM_AREA_K+1 |
|---|---|---|---|---|---|
| IDX_1 | 0xFFFF | 0xFFFF | ... | 0xFFFF | 0xFFFF |
| IDX_2 | 0xFFFF | 0xFFFF | ... | 0xFFFF | 0x0 |
| IDX_3 | 0xFFFF | 0x01F2 | ... | 0xFFFF | 0x0 |
| ... | ... | ... | ... | ... | ... |
| IDX_N-1 | 0x01F2 | 0xFFFF | ... | 0xFFFF | 0x0 |
| IDX_N | 0x009D | 0x0144 | ... | 0xFFFF | 0xFFFF | runtime bad area (value) == 0xFFFF : bad
(value) != 0xFFFF : normal
(value) == 0x0000 : normal (not remapped)

FIG.11

BAD_TBL

| | MEM_AREA_1 | MEM_AREA_2 | ... | MEM_AREA_K | MEM_AREA_K+1 (0x019d) | MEM_AREA_K+2 (0x01a1) |
|---|---|---|---|---|---|---|
| IDX_1 | 0xFFFF | 0xFFFF | ... | 0xFFFF | 0xFFFF | 0x0 |
| IDX_2 | 0xFFFF | 0xFFFF | ... | 0xFFFF | 0x0 | 0x0 |
| IDX_3 | 0xFFFF | 0x01F2 | ... | 0xFFFF | 0x0 | 0xFFFF |
| ... | ... | ... | ... | ... | ... | ... |
| IDX_N-1 | 0x01F2 | 0xFFFF | ... | 0xFFFF | 0x0 | 0xFFFF |
| IDX_N | 0x009D | 0x0144 | ... | 0xFFFF | 0xFFFF | 0x0 |

MEM_AREA_K+1, MEM_AREA_K+2: runtime bad area (value) == 0xFFFFF : bad
(value) != 0xFFFFF : normal
(value) == 0x0000 : normal (not remapped)

FIG. 12

BAD_TBL

| | MEM_AREA_1 | MEM_AREA_2 | ... | MEM_AREA_K | MEM_AREA_K+1 | MEM_AREA_K+2 (0x01A1) |
|---|---|---|---|---|---|---|
| IDX_1 | 0xFFFF | 0xFFFF | ... | 0xFFFF | 0xFFFF | 0x0 |
| IDX_2 | 0xFFFF | 0xFFFF | ... | 0xFFFF | 0x0 | 0x0 |
| IDX_3 | 0xFFFF | 0x01F2 | ... | 0xFFFF | 0x01A1 | 0xFFFF |
| ... | ... | ... | ... | ... | ... | ... |
| IDX_N-1 | 0x01F2 | 0xFFFF | ... | 0xFFFF | 0x01A1 | 0xFFFF |
| IDX_N | 0x009D | 0x0144 | ... | 0xFFFF | 0xFFFF | 0x0 | target bad memory area

Remapped to MEM_AREA_K+1

FIG. 13

BAD_TBL

| | MEM_AREA_1 | MEM_AREA_2 | ... | MEM_AREA_K | MEM_AREA_K+1 |
|---|---|---|---|---|---|
| IDX_1 | 0xFFFF | 0xFFFF | ... | 0xFFFF | 0xFFFF |
| IDX_2 | 0xFFFF | 0xFFFF | ... | 0xFFFF | 0x0 |
| IDX_3 | 0xFFFF | 0x01F2 | ... | 0xFFFF | 0x01A1 |
| ... | ... | ... | ... | ... | ... |
| IDX_N-1 | 0x01F2 | 0xFFFF | ... | 0xFFFF | 0x01A1 |
| IDX_N | 0x009D | 0x0144 | ... | 0xFFFF | 0xFFFF |

All bad sub_areas in the target bad memory area with address 0x01A1 remapped to normal sub_areas of MEM_AREA_K+1

MEMORY SYSTEM AND OPERATING METHOD THEREOF

CROSS-REFERENCE TO RELATED APPLICATION

The present application claims priority under 35 U.S.C. 119(a) to Korean patent application number 10-2020-0155418, filed on Nov. 19, 2020, which is incorporated herein by reference in its entirety.

BACKGROUND

1. Technical Field

Embodiments of the present application relate to a memory system and an operating method thereof.

2. Related Art

A memory system includes a data storage device or a memory device that stores data in response to a request from a host, such as a computer, servers, a smartphone, a tablet PC, or other electronic devices. Examples of the memory system may span from a traditional magnetic-disk-based hard disk drive (HDD) to a semiconductor-based data storage device such as a solid state drive (SSD), a universal flash storage device (UFS), or an embedded MMC (eMMC) device.

The memory system may further include a memory controller for controlling a memory device. The memory controller may receive a command from the host and, on the basis of the received command, may execute the command or control read/write/erase operations on the memory devices in the memory system. The memory controller may be used to execute firmware operations for performing a logical operation for controlling such operations.

Meanwhile, it may exist a defective area in which data is not normally read or written in the memory device. In this case, the memory controller may determine the location of the defective area in the memory device and manage the defective area not to be accessed.

SUMMARY

Embodiments of the disclosure may provide a memory system and an operating method thereof capable of minimizing the loss of storage capacity by recycling defective or bad memory area.

In addition, embodiments of the disclosure may provide a memory system and an operating method thereof capable of effectively managing the bad memory area generated during runtime.

In one aspect, embodiments of the disclosure may provide a memory system including a memory device having a plurality of memory areas and a memory controller for communicating with the memory device and controlling the memory device.

Each of the plurality of memory areas may include N sub-areas (N is a natural number greater than or equal to 2). Each sub-area may be (i) a bad sub-area with unrecoverable defects or (ii) a normal sub-area with no defects or with recoverable defects.

The memory controller may create a bad memory area replacement table including state information of a bad memory area, which is a memory area including at least one bad sub-area, among the plurality of memory areas.

The memory controller may add, when at least one runtime bad memory area among the plurality of memory areas occurs, the state information of the one or more runtime bad memory areas to the bad memory area replacement table.

The memory controller may remap, based on the bad memory area replacement table, a bad sub-area included in one target memory area among the runtime bad memory areas added to the bad memory area replacement table, to a normal sub-area included in one of remaining bad memory areas other than the target bad memory area, among the bad memory areas added to the bad memory area replacement table.

In another aspect, embodiments of the disclosure may provide a method of operating a memory system including a memory device having a plurality of memory areas.

Each of the plurality of memory areas may include N sub-areas (N is a natural number greater than or equal to 2). Each sub-area may be (i) a bad sub-area with unrecoverable defects or (ii) a normal sub-area with no defects or with recoverable defects.

The operating method of the memory system may include creating a bad memory area replacement table including state information of a bad memory area, which is a memory area including at least one of the bad sub-area, among the plurality of memory areas.

The method of operating the memory system may include adding, when at least one runtime bad memory area among the plurality of memory areas occurs, the state information of the one or more runtime bad memory areas to the bad memory area replacement table.

The method of operating the memory system may include remapping, based on the bad memory area replacement table, the bad sub-area included in one target memory area among the runtime bad memory areas added to the bad memory area replacement table to the normal sub-area included in one of remaining bad memory areas other than the target bad memory area among the bad memory areas added to the bad memory area replacement table.

In another aspect, embodiments of the disclosure may provide a method of creating a bad memory area replacement table in a memory system including a memory device and a memory controller, the memory device comprising a plurality of memory areas, each memory area comprising N sub-areas, N being a natural number greater than or equal to 2, each sub-area being a bad sub-area having an unrecoverable defect or a normal sub-area having no defect or a recoverable defect.

The method of creating a bad memory area replacement table in a memory system may include checking, by the memory controller, a firmware configured to manage the bad memory area replacement table.

The method of creating a bad memory area replacement table in a memory system may include determining whether the firmware has been updated.

The method of creating a bad memory area table in a memory system may include creating the bad memory area replacement table in the event that the firmware has been updated and returning back to determining whether the firmware has been updated in the event that the firmware has not been updated.

The bad memory area replacement table may include state information on a bad memory area among the plurality of memory areas.

According to some embodiments of the disclosure, the loss of storage capacity can be minimized by recycling a defective or bad memory area.

Furthermore, some embodiments of the disclosure can effectively manage a bad memory area generated during runtime.

BRIEF DESCRIPTION OF THE DRAWINGS

FIG. 9 is a diagram illustrating an example for creating the bad memory area replacement table of FIG. 8.

FIG. 10 and FIG. 11 are diagrams illustrating an operation for adding state information on the runtime bad memory area to the bad memory area replacement table of FIG. 9.

FIG. 12 is a diagram illustrating an operation of remapping the bad sub-area included in the target bad memory area added in FIG. 11.

FIG. 13 is a diagram illustrating an operation of deleting the state information of the target bad memory area for which remapping has been completed in FIG. 12 from the bad memory area replacement table.

DETAILED DESCRIPTION

Hereinafter, embodiments of the present disclosure are described in detail with reference to the accompanying drawings. Throughout the specification, reference to "an embodiment," "another embodiment" or the like does not necessarily refer to only one embodiment, and different references to any such phrase do not necessarily refer to the same embodiment(s). The term "embodiments" used herein does not necessarily refer to all embodiments.

Figure 1:
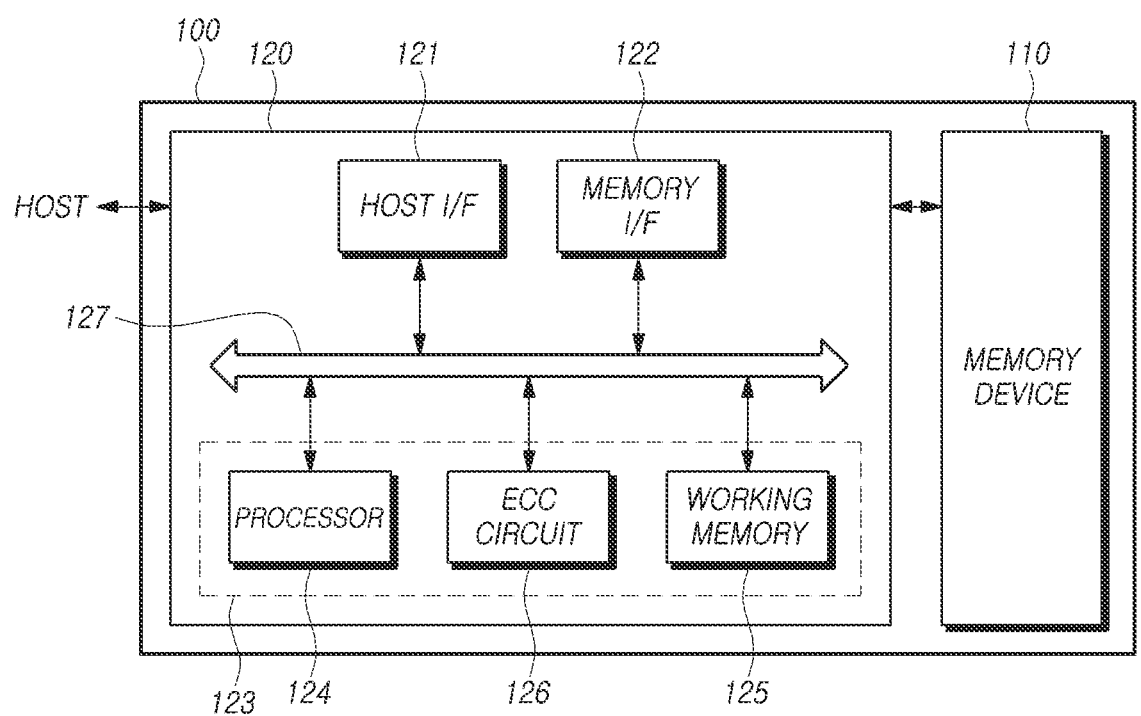
FIG. 1 is a schematic diagram illustrating a configuration of a memory system according to an exemplary embodiment of the disclosed technology.

FIG. 1 is a diagram illustrating a schematic configuration of a memory system 100 based on an exemplary embodiment of the disclosed technology.

In some implementations, the memory system 100 may include a memory device 110 configured to store data, and a memory controller 120 configured to control the memory device 110.

The memory device 110 may include multiple memory blocks each including a plurality of memory cells for storing data. The memory device 110 may be configured to operate in response to control signals received from the memory controller 120. Operations of the memory device 110 may include, for example, a read operation, a program operation (also referred to as a "write operation"), an erasure operation, and the like.

The memory cells in the memory device 110 are used to store data and may be arranged in a memory cell array. The memory cell array may be divided into memory blocks of memory cells and each block includes different pages of memory cells. In memory designs such as NAND flash memory devices, a page of memory cells is the smallest memory unit that can be programmed or written, and the data stored in memory cells can be erased at the block level.

In some implementations, the memory device 110 may be implemented as various types, such as a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), or a spin transfer torque random access memory (STT-RAM).

The memory device 110 may be implemented in a three-dimensional array structure. Some embodiments of the disclosed technology are applicable to any type of flash memory devices having an electric charge storage layer. In an implementation, the electric charge storage layer may be formed of a conductive material, and such an electric charge storage layer can be referred to as a floating gate. In another implementation, the electric charge storage layer may be formed of an insulating material, and such a flash memory device can be referred to as a charge trap flash (CTF).

The memory device 110 may be configured to receive a command and an address from the memory controller 120 to access an area of the memory cell array selected using the address. That is, the memory device 110 may perform an operation corresponding to the received command on a memory area of the memory device having a physical address corresponding to the received address from the memory controller 120.

In some implementations, the memory device 110 may perform a program operation, a read operation, an erasure operation, and the like. During a program operation, the memory device 110 may write data into an area selected by an address. During a read operation, the memory device 110 may read data from a memory area selected by an address. During an erasure operation, the memory device 110 may erase data stored in a memory area selected by an address.

The memory controller 120 may control write (program), read, erasure, and background operations that are performed on the memory device 110. The background operation may include, for example, operations that are implemented to optimize the overall performance of the memory device 110, such as a garbage collection (GC) operation, a wear leveling (WL) operation, and a bad block management (BBM) operation.

The memory controller 120 may control operations of the memory device 110 at the request of a host. Alternatively, the memory controller 120 may control the operations of the memory device 110 even in the absence of request from the host when it performs such background operations of the memory device.

The memory controller 120 and the host may be separate devices. In some implementations, the memory controller 120 and the host may be integrated and implemented as a single device. In the following description, the memory controller 120 and the host will be discussed as separate devices as a not limiting example.

Referring to FIG. 1, the memory controller 120 may include a memory interface 122, a control circuit 123, and a host interface 121.

The host interface 121 may be configured to provide an interface for communication with the host.

When receiving a command from the host HOST, the control circuit 123 may receive the command through the host interface 121 and may perform an operation in response to the received command.

The memory interface 122 may be directly or indirectly connected to the memory device 110 to provide an interface for communication with the memory device 110. That is, the memory interface 122 may be configured to provide the memory device 110 and the memory controller 120 with an interface for the memory controller 120 to perform memory operations in the memory device 110 based on control signals and instructions from the control circuit 123.

The control circuit 123 may be configured to control operations of the memory device 110 through the memory controller 120. For example, the control circuit 123 may include a processor 124 and a working memory 125. The control circuit 123 may further include an error detection/correction circuit (ECC circuit) 126 and the like configured to detect and correct errors.

The processor 124 may control the overall operation of the memory controller 120. The processor 124 may perform a logical operation. The processor 124 may communicate with the host HOST through the host interface 121. The processor 124 may communicate with the memory device 110 through the memory interface 122.

The processor 124 may be configured to perform operations associated with a flash translation layer (FTL) to effectively manage the memory operations in the memory system 100. The processor 124 may translate a logical block address (LBA) provided by the host into a physical block address (PBA) through the FTL. The FTL may receive the LBA and translate the LBA into the PBA by using a mapping table.

There are various address mapping methods which may be employed by the FTL, based on a mapping unit. Typical address mapping methods may include a page mapping method, a block mapping method, and a hybrid mapping method.

The processor 124 may be configured to randomize data received from the host to write the randomized data to the memory cell array. For example, the processor 124 may randomize data received from the host by using a randomizing seed. The randomized data is provided to the memory device 110 and written to the memory cell array.

The processor 124 may be configured to derandomize data received from the memory device 110 during a read operation. For example, the processor 124 may derandomize data received from the memory device 110 by using a derandomizing seed. The derandomized data may be output to the host HOST.

The processor 124 may execute firmware (FW) to control the operation of the memory controller 120. In other words, the processor 124 may control the overall operation of the memory controller 120 and, in order to perform a logical operation, may execute (drive) firmware loaded into the working memory 125 during booting.

The term "firmware" may refer to a program or software stored in a certain nonvolatile memory and is executed by the processor 124 inside the memory system 100.

In some implementations, the firmware may include various functional layers. For example, the firmware may include at least one of a flash translation layer (FTL) configured to translate a logical address in the host HOST requests to a physical address of the memory device 110, a host interface layer (HIL) configured to interpret a command that the host HOST issues to a data storage device such as the memory system 100 and to deliver the command to the FTL, and a flash interface layer (FIL) configured to deliver a command issued by the FTL to the memory device 110.

For example, the firmware may be stored in the memory device 110, and then loaded into the working memory 125.

The working memory 125 may store firmware, program codes, commands, or pieces of data necessary to operate the memory controller 120. The working memory 125 may include, for example, at least one of a static RAM (SRAM), a dynamic RAM (DRAM), and a synchronous RAM (SDRAM) as a volatile memory.

The error detection/correction circuit 126 may be configured to detect and correct one or more erroneous bits in the data by using an error detection and correction code. In some implementations, the data that is subject to the error detection and correction may include data stored in the working memory 125, and data retrieved from the memory device 110.

The error detection/correction circuit 126 may be implemented to decode data by using the error correction code. The error detection/correction circuit 126 may be implemented by using various decoding schemes. For example, a decoder that performs nonsystematic code decoding or a decoder that performs systematic code decoding may be used.

In some implementations, the error detection/correction circuit 126 may detect one or more erroneous bits on a sector basis. That is, each piece of read data may include multiple sectors. In this disclosure, a sector may refer to a data unit that is smaller than the read unit (e.g., page) of a flash memory. Sectors constituting each piece of read data may be mapped based on addresses.

In some implementations, the error detection/correction circuit 126 may calculate a bit error rate (BER) and determine whether the number of erroneous bits in the data is within the error correction capability sector by sector. For example, if the BER is higher than a reference value, the error detection/correction circuit 126 may determine that the erroneous bits in the corresponding sector are uncorrectable and the corresponding sector is marked "fail." If the BER is lower than or equals to the reference value, the error detection/correction circuit 126 may determine that the corresponding sector is correctable or the corresponding sector can be marked "pass."

The error detection/correction circuit 126 may perform error detection and correction operations successively on all read data. When a sector included in the read data is correctable, the error detection/correction circuit 126 may move on to the next sector to check as to whether an error correction operation is needed on the next sector. Upon completion of the error detection and correction operations on all the read data in this manner, the error detection/correction circuit 126 may acquire information as to which sector is deemed uncorrectable in the read data. The error detection/correction circuit 126 may provide such information (e.g., address of uncorrectable bits) to the processor 124.

The memory system 100 may also include a bus 127 to provide a channel between the constituent elements 121, 122, 124, 125, and 126 of the memory controller 120. The bus 127 may include, for example, a control bus for delivering various types of control signals and commands, and a data bus for delivering various types of data.

By way of example, FIG. 1 illustrates the above-mentioned constituent elements 121, 122, 124, 125, and 126 of the memory controller 120. It is noted that some of those elements illustrated in the drawings may be omitted, or some of the above-mentioned constituent elements 121, 122, 124, 125, and 126 of the memory controller 120 may be integrated into a single element. In addition, in some implementations, one or more other constituent elements may be added to the above-mentioned constituent elements of the memory controller 120.

Figure 2:
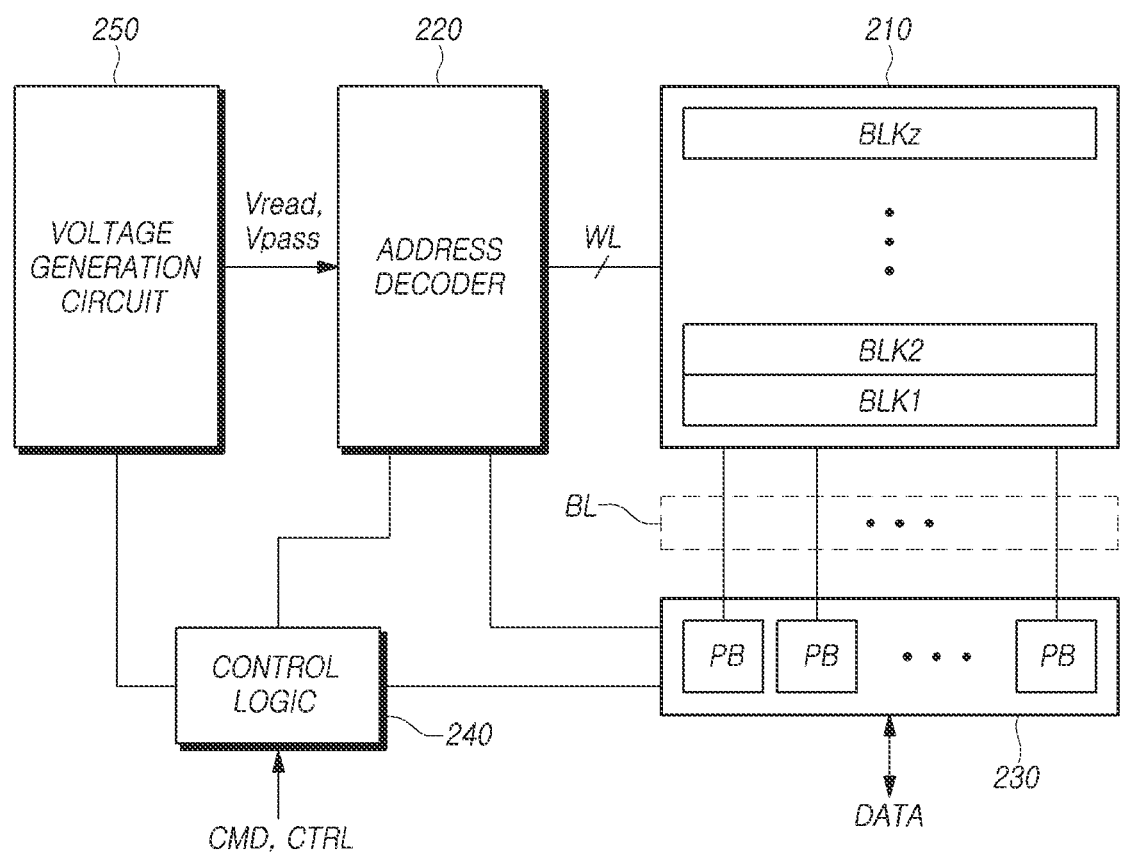
FIG. 2 is a block diagram schematically illustrating a memory device according to an exemplary embodiment of the disclosed technology.

FIG. 2 is a block diagram schematically illustrating a memory device 110 based on an exemplary embodiment of the disclosed technology.

In some implementations, the memory device 110 based on an embodiment of the disclosed technology may include a memory cell array 210, an address decoder 220, a read/write circuit 230, a control logic 240, and a voltage generation circuit 250.

The memory cell array 210 may include multiple memory blocks BLK1-BLKz, where z is a natural number equal to or larger than 2.

In the multiple memory blocks BLK1-BLKz, multiple word lines WL and multiple bit lines BL may be disposed in rows and columns, and multiple memory cells MC may be arranged.

The multiple memory blocks BLK1-BLKz may be connected to the address decoder 220 through the multiple word lines WL. The multiple memory blocks BLK1-BLKz may be connected to the read/write circuit 230 through the multiple bit lines BL.

Each of the multiple memory blocks BLK1-BLKz may include multiple memory cells. For example, the multiple memory cells are nonvolatile memory cells. In some implementations, such nonvolatile memory cells may be arranged in a vertical channel structure.

The memory cell array 210 may be configured as a memory cell array having a two-dimensional structure. In some implementations, the memory cell array 210 may be arranged in a three-dimensional structure.

Each of the multiple memory cells included in the memory cell array 210 may store at least one bit of data. For example, each of the multiple memory cells included in the memory cell array 210 may be a single-level cell (SLC) configured to store one bit of data. As another example, each of the multiple memory cells included in the memory cell array 210 may be a multi-level cell (MLC) configured to store two bits of data per memory cell. As another example, each of the multiple memory cells included in the memory cell array 210 may be a triple-level cell (TLC) configured to store three bits of data per memory cell. As yet another example, each of the multiple memory cells included in the memory cell array 210 may be a quad-level cell (QLC) configured to store four bits of data per memory cell. As still another example, the memory cell array 210 may include multiple memory cells, each of which may be configured to store at least five bits of data per memory cell.

Referring to FIG. 2, the address decoder 220, the read/write circuit 230, the control logic 240, and the voltage generation circuit 250 may operate as peripheral circuits configured to drive the memory cell array 210.

The address decoder 220 may be connected to the memory cell array 210 through the multiple word lines WL.

The address decoder 220 may be configured to operate in response to command and control signals of the control logic 240.

The address decoder 220 may receive addresses through an input/output buffer inside the memory device 110. The address decoder 220 may be configured to decode a block address among the received addresses. The address decoder 220 may select at least one memory block based on the decoded block address.

The address decoder 220 may receive a read voltage Vread and a pass voltage Vpass from the voltage generation circuit 250.

The address decoder 220 may, during a read operation, apply the read voltage Vread to a selected word line WL inside a selected memory block and apply the pass voltage Vpass to the remaining non-selected word lines WL.

The address decoder 220 may apply a verification voltage generated by the voltage generation circuit 250 to a selected word line WL inside a selected memory block, during a program verification operation, and may apply the pass voltage Vpass to the remaining non-selected word lines WL.

The address decoder 220 may be configured to decode a column address among the received addresses. The address decoder 220 may transmit the decoded column address to the read/write circuit 230.

The memory device 110 may perform the read operation and the program operation page by page. Addresses received when the read operation and the program operation are requested may include at least one of a block address, a row address, and a column address.

The address decoder 220 may select one memory block and one word line based on the block address and the row address. The column address may be decoded by the address decoder 220 and provided to the read/write circuit 230.

The address decoder 220 may include at least one of a block decoder, a row decoder, a column decoder, and an address buffer.

The read/write circuit 230 may include multiple page buffers PB. The read/write circuit 230 may operate as a "read circuit" when the memory cell array 210 performs a read operation, and may operate as a "write circuit" when the memory cell array 210 performs a write operation.

The above-mentioned read/write circuit 230 is also referred to as a page buffer circuit including multiple page buffers PB, or a data register circuit. The read/write circuit 230 may include a data buffer that participates in a data processing function and, in some implementations, may further include a cache buffer for data caching.

The multiple page buffers PB may be connected to the memory cell array 210 through the multiple bit lines BL. In order to detect or sense the threshold voltage Vth of the memory cells during a read operation and a program verification operation, the multiple page buffers PB may continuously supply a sensing current to the bit lines BL connected to the memory cells to detect, at a sensing node, a change proportional to the amount of current that varies depending on the program state of a corresponding memory cell, and may hold or latch the corresponding voltage as sensing data.

The read/write circuit 230 may operate in response to page buffer control signals output from the control logic 240.

During a read operation, the read/write circuit 230 senses a voltage value of a memory cell and the voltage value is read out as data. The read/write circuit 230 temporarily stores the retrieved data, and outputs the data DATA to the input/output buffer of the memory device 110. In an embodiment, the read/write circuit 230 may include a column selection circuit, in addition to the page buffers PB or page registers.

The control logic 240 may be connected to the address decoder 220, the read/write circuit 230, and the voltage generation circuit 250. The control logic 240 may receive a command CMD and a control signal CTRL through the input/output buffer of the memory device 110.

The control logic 240 may be configured to control the overall operation of the memory device 110 in response to the control signal CTRL. The control logic 240 may output a control signal for adjusting the voltage level of sensing nodes of multiple page buffers PB to a pre-charge voltage level.

The control logic 240 may control the read/write circuit 230 to perform a read operation in the memory cell array 210. The voltage generation circuit 250 may generate a read voltage Vread and a pass voltage Vpass, which are used during the read operation, in response to a voltage generation circuit control signal output from the control logic 240.

A memory block BLK disposed in the memory device 110 may include multiple pages PG. In some implementations, a plurality of memory cells arranged in columns form memory cell strings, and a plurality of memory cells arranged in rows form memory blocks. Each of the multiple pages PG is coupled to one of word lines WL, and each of the memory cell strings STR is coupled to one of bit lines BL.

In the memory block BLK, multiple word lines WL and multiple bit lines BL may be arranged in rows and columns. For example, each of the multiple word lines WL may be arranged in the row direction, and each of the multiple bit lines BL may be arranged in the column direction. Alternatively, each of the multiple word lines WL may be arranged in the column direction, and each of the multiple bit lines BL may be arranged in the row direction.

In some implementations, the multiple word lines WL and the multiple bit lines BL may intersect with each other and electrically isolated from each other, thereby addressing a single memory cell in the array of multiple memory cells MC. In some implementations, each memory cell MC may include a transistor TR that includes a material layer that can hold an electrical charge.

For example, the transistor TR arranged in each memory cell MC may include a drain, a source, and a gate. The drain (or source) of the transistor TR may be connected to the corresponding bit line BL directly or via another transistor TR. The source (or drain) of the transistor TR may be connected to the source line (which may be the ground) directly or via another transistor TR. The gate of the transistor TR may include a floating gate (FG) surrounded by an insulator, and a control gate (CG) to which a gate voltage is applied from a word line WL.

In each of the multiple memory blocks BLK1-BLKz, a first selection line (also referred to as a source selection line or a drain selection line) may be additionally arranged outside the first outermost word line, which is closer to the read/write circuit 230 among two outermost word lines, and a second selection line (also referred to as a drain selection line or a source selection line) may be additionally arranged outside the other second outermost word line.

In some implementations, at least one dummy word line may be additionally arranged between the first outermost word line and the first selection line. In addition, at least one dummy word line may be additionally arranged between the second outermost word line and the second selection line.

A read operation and a program operation (write operation) of the memory block may be performed page by page, and an erasure operation may be performed memory block by memory block.

Figure 3:
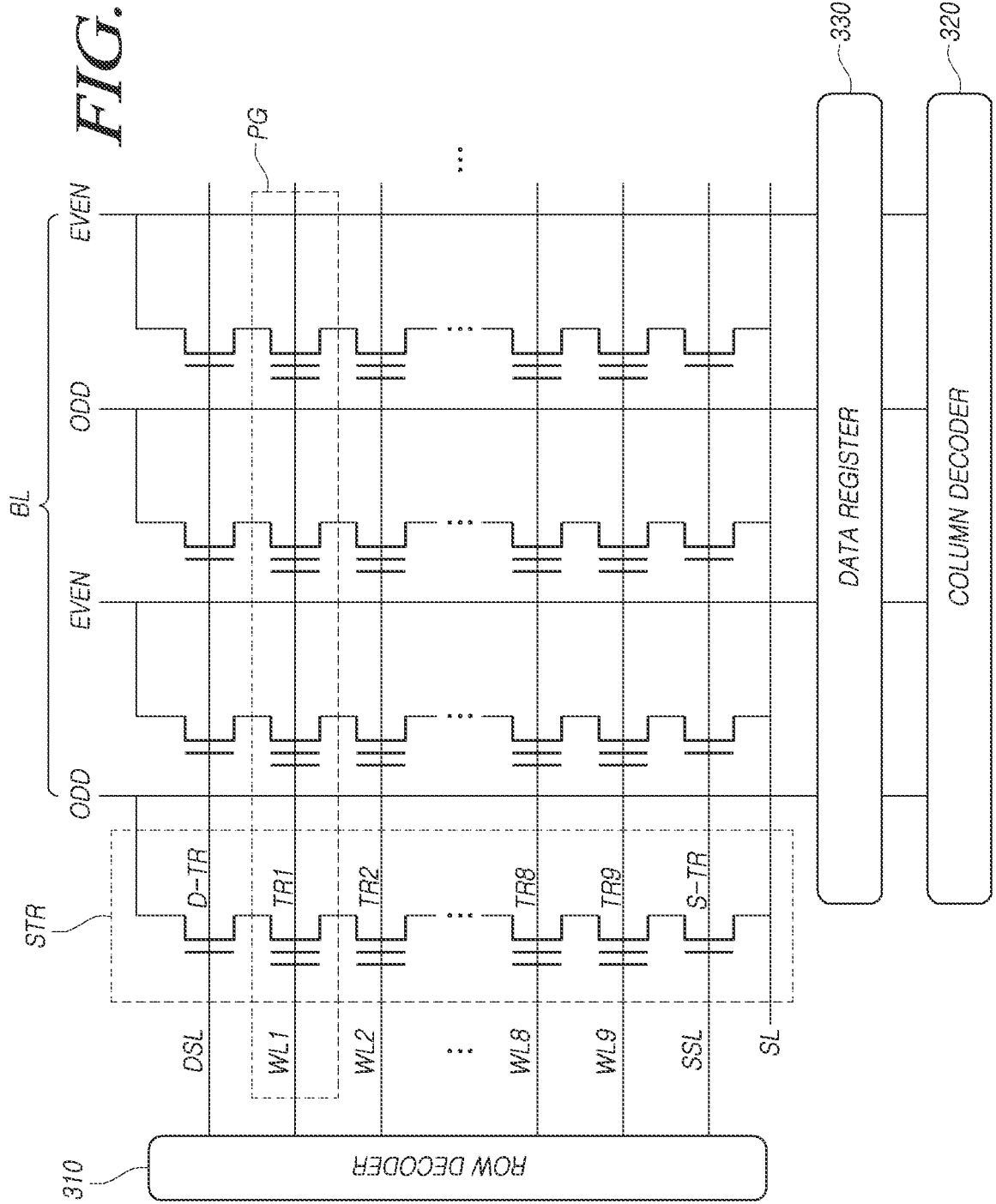
FIG. 3 is a diagram illustrating a structure of word lines and bit lines of a memory device according to an exemplary embodiment of the disclosed technology.

FIG. 3 is a diagram illustrating a structure of word lines WL and bit lines BL of a memory device 110 based on an exemplary embodiment of the disclosed technology.

Referring to FIG. 3, the memory device 110 has a core area in which memory cells MC are arranged, and an auxiliary area (the remaining area other than the core area) to include circuitry that is used to perform the operations of the memory cell array 210.

In the core area, a certain number of memory cells arranged in one direction can be called "page" PG, and a certain number of memory cells that are coupled in series can be called "memory cell string" STR.

The word lines WL1-WL9 may be connected to a row decoder 310. The bit lines BL may be connected to a column decoder 320. A data register 330, which corresponds to the read/write circuit 230 of FIG. 2, may exist between the multiple bit lines BL and the column decoder 320.

The multiple word lines WL1-WL9 may correspond to multiple pages PG.

For example, each of the multiple word lines WL1-WL9 may correspond to one page PG as illustrated in FIG. 3. When each of the multiple word lines WL1-WL9 has a large size, each of the multiple word lines WL1-WL9 may correspond to at least two (e.g., two or four) pages PG. Each page PG is the smallest unit in a program operation and a read operation, and all memory cells MC within the same page PG may perform simultaneous operations when conducting a program operation and a read operation.

The multiple bit lines BL may be connected to the column decoder 320. In some implementations, the multiple bit lines BL may be divided into odd-numbered bit lines BL and even-numbered bit lines BL such that a pair of odd-numbered bit line and even-numbered bit line is coupled in common to a column decoder 320.

In accessing a memory cell MC, the row decoder 310 and the column decoder 320 are used to locate a desired memory cell based on the address.

In some implementations, the data register 330 plays an important role because all data processing by the memory device 110, including program and read operations, occurs via the data register 330. If data processing by the data register 330 is delayed, all of the other areas need to wait until the data register 330 finishes the data processing, degrading the overall performance of the memory device 110.

Referring to the example illustrated in FIG. 3, in one memory cell string STR, multiple transistors TR1-TR9 may be connected to multiple word lines WL1-WL9, respectively. In some implementations, the multiple transistors TR1-TR9 correspond to memory cells MC. In this example, the multiple transistors TR1-TR9 include control gates CG and floating gates FG.

The multiple word lines WL1-WL9 include two outermost word lines WL1 and WL9. A first selection line DSL may be additionally arranged outside the first outermost word line WL1, which is closer to the data register 330 and has a shorter signal path compared to the other outermost word line WL9. A second selection line SSL may be additionally arranged outside the other second outermost word line WL9.

The first selection transistor D-TR, which is controlled to turn on/off by the first selection line DSL, has a gate electrode connected to the first selection line DSL, but includes no floating gate FG. The second selection transistor S-TR, which is controlled to turn on/off by the second selection line SSL, has a gate electrode connected to the second selection line SSL, but includes no floating gate FG.

The first selection transistor D-TR is used as a switch circuit that connects the corresponding memory cell string STR to the data register 330. The second selection transistor S-TR is used as a switch that connects the corresponding memory cell string STR to the source line SL. That is, the first selection transistor D-TR and the second selection transistor S-TR can be used to enable or disable the corresponding memory cell string STR.

In some implementations, the memory system 100 applies a predetermined turn-on voltage Vcc to the gate electrode of the first selection transistor D-TR, thereby turning on the first selection transistor D-TR, and applies a predetermined turn-off voltage (e.g., 0V) to the gate electrode of the second selection transistor S-TR, thereby turning off the second selection transistor S-TR.

The memory system 100 turns on both the first and second selection transistors D-TR and S-TR during a read operation or a verification operation. Accordingly, during a read operation or a verification operation, an electric current may flow through the corresponding memory cell string STR and drain to the source line SL, which corresponds to the ground, such that the voltage level of the bit line BL can be measured. However, during a read operation, there may be a time difference in the on/off timing between the first selection transistor D-TR and the second selection transistor S-TR.

The memory system 100 may apply a predetermined voltage (e.g., +20V) to the substrate through a source line SL during an erasure operation. The memory system 100 applies a certain voltage to allow both the first selection transistor D-TR and the second selection transistor S-TR to float during an erasure operation. As a result, the applied erasure voltage can remove electrical charges from the floating gates FG of the selected memory cells.

Figure 4:
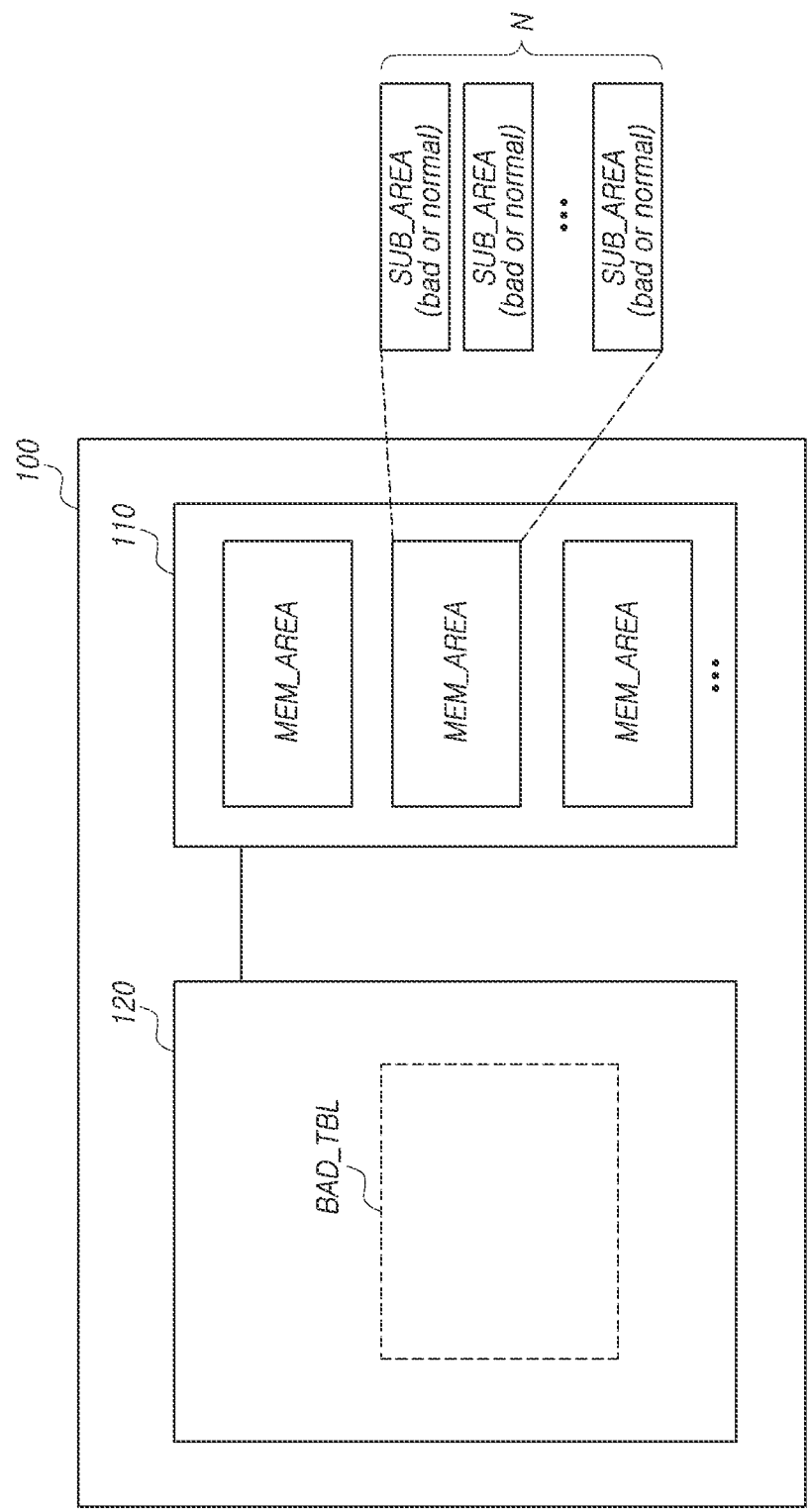
FIG. 4 is a diagram illustrating a schematic structure of a memory system according to an exemplary embodiment of the present disclosure.

FIG. 4 is a diagram illustrating a schematic structure of the memory system 100 according to an exemplary embodiment of the present disclosure.

Referring to FIG. 4, the memory device 110 of the memory system 100 may include a plurality of memory areas MEM_AREA.

Each memory area MEM_AREA may include N (N is a natural number of 2 or more) of sub-areas SUB_AREA.

Each sub-area SUB_AREA may be a bad sub-area or a normal sub-area. The bad sub-area may be a sub-area in which an unrecoverable defect has occurred, and the normal sub-area may be a sub-area in which no defect or recoverable defect has occurred. In this case, the unrecoverable or recoverable defect may already exist in the manufacturing process, or may occur in the process of performing a memory operation (e.g., read, write, or erase operation) during runtime.

If data is stored in the bad sub-area, there may be a high probability that an error may occur in the operation of reading data stored in the bad sub-area or writing data to the bad sub-area. Accordingly, the memory controller 120 of the memory system 100 manages the plurality of memory areas MEM_AREA so as not to access the bad sub-area existing in the memory device 110.

To this end, the memory controller 120 may create a bad memory area replacement table BAD_TBL including state information of the bad memory area among the plurality of memory areas MEM_AREA. The bad memory area may be a memory area MEM_AREA having at least one bad sub-area.

The bad memory area replacement table BAD_TBL may be stored in the working memory 125, in one embodiment. In another embodiment, the bad memory area replacement table BAD_TBL may be stored in the memory device 110 and then loaded into the working memory 125.

Hereinafter, the operation in which the memory system 100 manages the bad memory area using the bad memory area replacement table BAD_TBL will be described.

Figure 5:
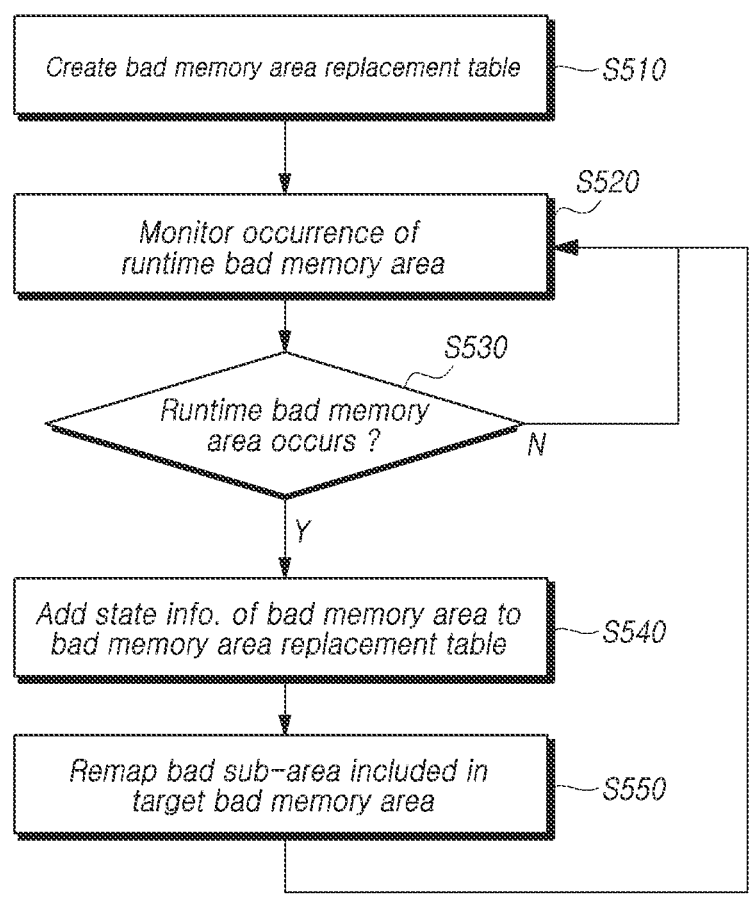
FIG. 5 is a flowchart illustrating an operation of a memory system according to an exemplary embodiment of the present disclosure.

FIG. 5 is a flowchart illustrating an operation of the memory system 100 according to an exemplary embodiment of the present disclosure.

Referring to FIG. 5, the memory controller 120 of the memory system 100 may create a bad memory area replacement table BAD_TBL including state information of a bad memory area among the plurality of memory areas MEM_AREA (S510). In this case, the state information of the bad memory area may be information indicating which sub-area is bad sub-area and which sub-area is normal sub-area among a plurality of sub-areas included in the bad memory area.

All or part of the plurality of memory areas MEM_AREA may be an initial bad memory area in which the bad sub-area is generated during the manufacturing process. The memory controller 120 may, for example, read a specific byte of a spare area in a corresponding memory area and check whether the corresponding memory area is the initial bad memory area. In addition, when creating the bad memory area replacement table BAD_TBL, the memory controller 120 may include state information on the initial bad memory area in the bad memory area replacement table BAD_TBL.

In some embodiments of the present disclosure, the created bad memory area replacement table BAD_TBL is not in a read-only state, but in a state in which read and write are possible. Accordingly, the memory controller 120 may modify the bad memory area replacement table BAD_TBL even after the bad memory area replacement table BAD_TBL is created.

In addition, the memory controller 120 may monitor whether at least one runtime bad memory area, which is a bad memory area in which at least one bad sub-area has occurred, has occurred during runtime after the memory controller 120 starts operation (S520). For example, when a memory operation such as an erase operation, read operation, or program operation for a specific memory area fails during runtime, the memory controller 120 may monitor whether the runtime bad memory area has occurred by verifying whether an unrecoverable defect such as an uncorrectable error correction code (UECC) has occurred in the corresponding memory area.

The memory controller 120 may analyze the monitoring result performed in step S520, and may determine whether at least one runtime bad memory area has occurred (S530).

In the case that no runtime bad memory area has occurred (S530-N), the memory controller 120 may loop back to step S520 to monitor again whether any runtime bad memory area has occurred.

On the other hand, in the case that at least one runtime bad memory area occurs (S530-Y), the memory controller 120 may add state information of the generated runtime bad memory area to the bad memory area replacement table BAD_TBL (S540). Thereafter, the memory controller 120 may manage the runtime bad memory area based on the bad memory area replacement table BAD_TBL, and reuse the normal sub-area included in the runtime bad memory area.

In addition, the memory controller 120 may remap, based on the bad memory area replacement table BAD_TBL, the bad sub-area included in a target bad memory area among the runtime bad memory areas added to the bad memory area replacement table BAD_TBL to a normal sub-area included in one of remaining bad memory areas other than the target bad memory area among the bad memory areas added to the bad memory area replacement table BAD_TBL (S550). Further, the memory controller 120 may loop back to step S520 to monitor again whether any runtime bad memory area has occurred.

As described above, by remapping the bad sub-area included in the target bad memory area to another normal sub-area, the target bad memory area can be reused as a memory area capable of normally storing data. Therefore, it is possible to minimize the loss of storage capacity that would occur when the entire runtime bad memory area is not used.

Hereinafter, the operation of the memory system 100 in FIGS. 4 and 5 will be described in greater detail below. First, the structure of the memory area MEM_AREA will be described.

In one embodiment, N sub-areas disposed in the memory area MEM_AREA may be included in one memory block described in FIGS. 2 and 4, but may be distributed in different memory blocks or in different physical locations.

Figure 6:
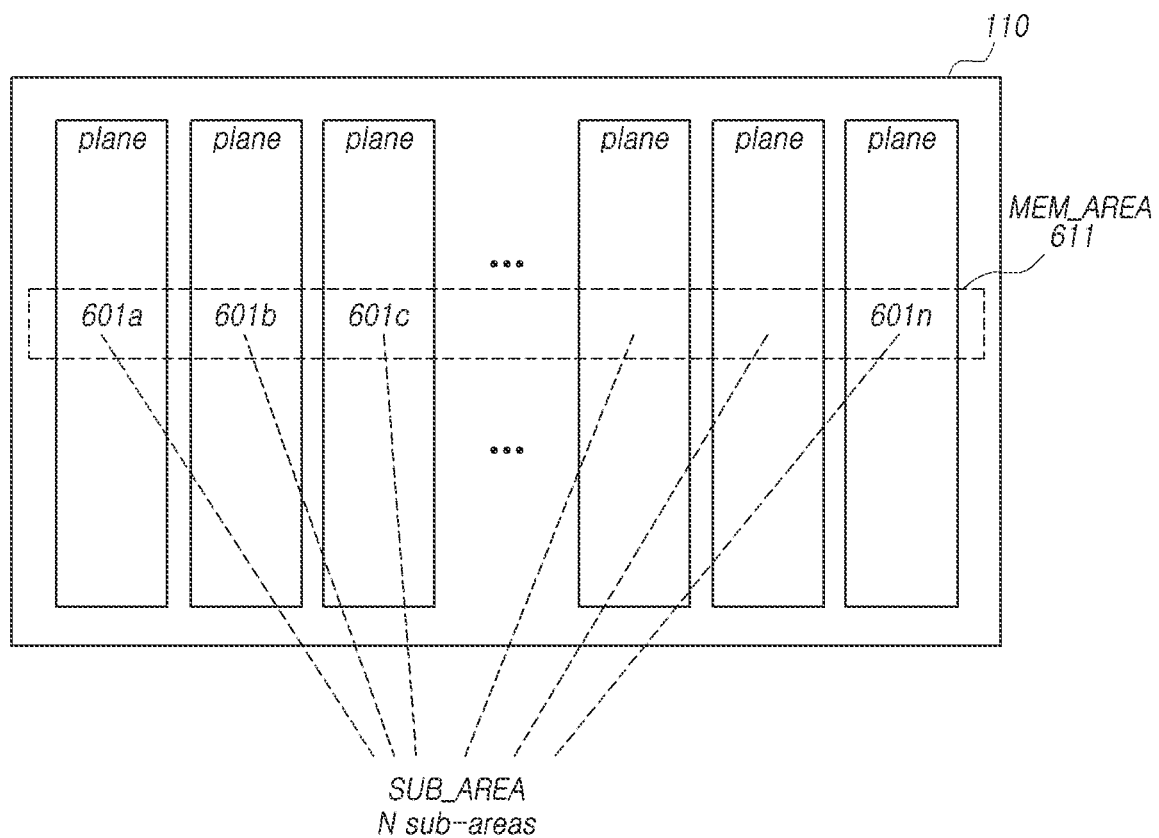
FIG. 6 is a diagram illustrating an exemplary structure of a memory area according to embodiments of the present disclosure.

FIG. 6 is a diagram illustrating an exemplary structure of a memory area MEM_AREA according to embodiments of the present disclosure.

The memory device 110 of the memory system 100 may include a plurality of planes.

The plurality of planes may be divided into one or more plane groups disposed in different memory dies (not shown) according to some embodiments. For example, the memory device 110 may include four memory dies, each of the four memory dies may include 4 planes (16 planes in total).

Referring to FIG. 6, each of the N sub-areas SUB_AREA included in one memory area MEM_AREA may be located on a different plane among the plurality of planes described above. That is, the N sub-areas SUB_AREA 601a, 601b, 601c, . . . , 601n included in a memory area MEM_AREA 611 may be logically included in one common memory area MEM_AREA, but may be physically distributed across different memory areas.

Figure 7:
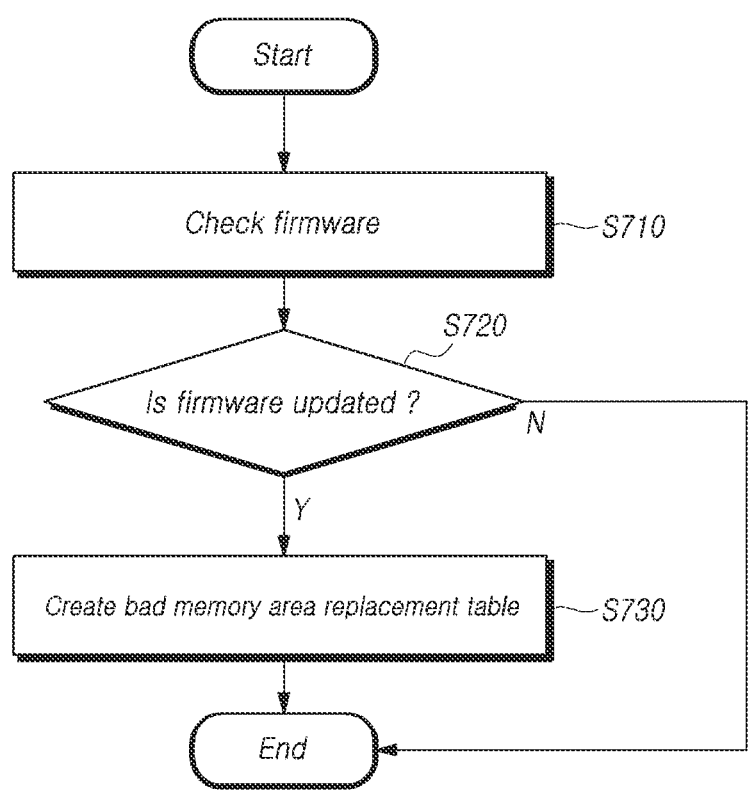
FIG. 7 is a flowchart illustrating an operation of creating a bad memory area replacement table by a memory system according to an exemplary embodiment of the present disclosure.

FIG. 7 is a flowchart illustrating an operation of creating a bad memory area replacement table BAD_TBL by the memory system 100 according to an exemplary embodiment of the present disclosure.

Referring to FIG. 7, the memory controller 120 of the memory system 100 may check the firmware run by the memory controller 120 (S710) for an update status of the firmware. The firmware may be run to control the operation of the memory controller 120, and in particular, may be used to manage the bad memory area replacement table BAD_TBL.

The memory controller 120 may determine whether the firmware checked in step S710 has been updated (S720). For example, the memory controller 120 may determine whether the firmware has been updated by checking a flag indicating update status of the firmware or whether a version of the firmware is changed during booting up of the memory system 100.

When the memory controller 120 determines that the firmware is updated (S720-Y), the memory controller 120 may create the bad memory area replacement table BAD_TBL (S730). If a previously created bad memory area replacement table exists, the memory controller 120 may delete the previously created bad memory area replacement table, or may overwrite the previously created bad memory area replacement table with a newly created bad memory area replacement table BAD_TBL.

Hereinafter, it will be described an exemplary structure for the bad memory area replacement table BAD_TBL and a process of changing the bad memory area replacement table BAD_TBL according to the occurrence of the bad memory area with reference to FIGS. 8 to 13.

Figure 8:
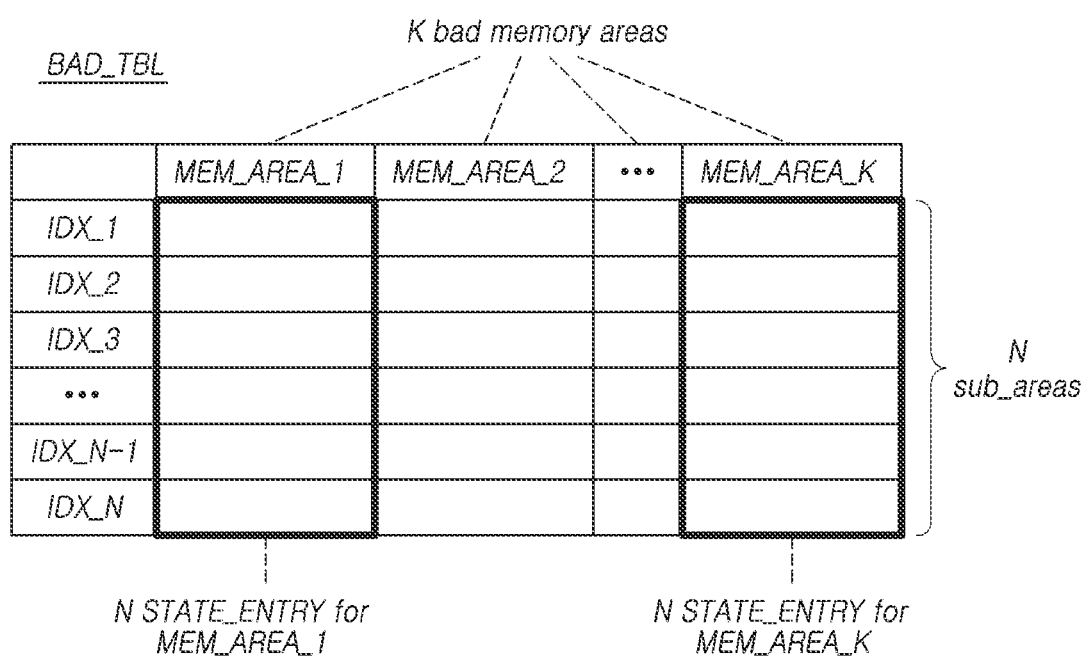
FIG. 8 is a diagram illustrating an exemplary structure of a bad memory area replacement table according to an exemplary embodiment of the present disclosure.

FIG. 8 is a diagram illustrating an exemplary structure for a bad memory area replacement table BAD_TBL according to one embodiment of the present disclosure.

Referring to FIG. 8, when the bad memory area replacement table BAD_TBL is created, the bad memory area replacement table BAD_TBL may include state information on K (K is a natural number) bad memory areas MEM_AREA_1, MEM_AREA_2, . . . , MEM_AREA_K.

The state information for each bad memory area may include N state entries STATE_ENTRY corresponding to each of the N sub-areas included in the corresponding bad memory area. In this case, N indexes IDX_1, IDX_2, IDX_3, . . . , IDX_N−1, IDX_N may be used to distinguish the N state entries STATE_ENTRY.

Each state entry STATE_ENTRY may indicate whether a corresponding sub-area is a bad sub-area, or each state entry STATE_ENTRY may include information on the memory area MEM_AREA in which the corresponding sub-area is remapped.

In this case, each state entry STATE_ENTRY may be set to a first value (e.g., 0xFFFF) when the corresponding sub-area is the bad sub-area, and each state entry STATE_ENTRY may be set to another value other than the first value when the corresponding sub-area is a normal sub-area.

If a sub-area corresponding to a state entry STATE_ENTRY is a normal sub-area, the sub-area may be remapped to another memory area MEM_AREA, but there may be no memory area to be remapped.

If there is no memory area to which the corresponding sub-area may be remapped, the corresponding state entry STATE_ENTRY may be set to a second value (e.g., 0x0 or 0x0000). On the other hand, when the corresponding sub-area is remapped to another memory area MEM_AREA, the corresponding state entry STATE_ENTRY may be set to the address value of the remapped memory area MEM_AREA.

FIG. 9 is a diagram illustrating an example for creating the bad memory area replacement table BAD_TBL of FIG. 8.

Referring to FIG. 9, in the case that the sub-area corresponding to the state entry STATE_ENTRY is a bad sub-area, the value of the corresponding state entry STATE_ENTRY may be set to 0xFFFF. On the other hand, if the sub-area corresponding to the state entry STATE_ENTRY is a normal sub-area, the value of the corresponding state entry STATE_ENTRY may indicate information on the remapped memory area MEM_AREA.

In FIG. 9, the value of the state entry STATE_ENTRY corresponding to the first index IDX_1 of the first memory area MEM_AREA_1 is 0xFFFF (65535 in decimal). Accordingly, this indicates that in the first memory area MEM_AREA_1, the sub-area corresponding to the first index IDX_1 of the corresponding state entry STATE_ENTRY is a bad sub-area.

On the other hand, the value of the state entry STATE_ENTRY corresponding to the N-th index IDX_N included in the first memory area MEM_AREA_1 is 0x009D, i.e., different from 0xFFFF (denoted by the symbol "!=" or "not equal to"). Accordingly, this indicates that in the first memory area MEM_AREA_1, the sub-area corresponding to the N-th index IDX_N of the state entry STATE_ENTRY is a normal sub-area, and the corresponding sub-area has been remapped to the memory area with the address value of 0x009D.

FIG. 10 and FIG. 11 are diagrams illustrating an exemplary operation for adding state information on a runtime bad memory area to the bad memory area replacement table BAD_TBL of FIG. 9.

Referring to FIG. 10, in the case that the (K+1)th memory area MEM_AREA_K+1 becomes a runtime bad memory area, state information on the (K+1)th memory area MEM_AREA_K+1 may be added to the bad memory area replacement table BAD_TBL. In an exemplary embodiment, when an unrecoverable defect is detected by the memory controller 120 during memory operation, for example, while a read operation, a program operation, or an erase operation is being executed for the (K+1)th memory area MEM_AREA_K+1, the memory controller 120 may add the state information on the (K+1)th memory area MEM_AREA_K+1 to the bad memory area replacement table BAD_TBL.

In FIG. 10, the value of the state entry STATE_ENTRY corresponding to the first index IDX_1 of the (K+1)th memory area MEM_AREA_K+1 is 0xFFFF. Accordingly, this indicates that in the (K+1)th memory area MEM_AREA_K+1, the sub-area corresponding to the first index IDX_1 of the corresponding state entry STATE_ENTRY is the bad sub-area.

On the other hand, the value of the state entry STATE_ENTRY corresponding to the second index IDX_2 of the (K+1)th memory area MEM_AREA_K+1 is 0x0 (or 0x0000). Accordingly, this indicates that in the K+1th memory area MEM_AREA_K+1, the sub-area corresponding to the second index IDX_2 of the corresponding state entry STATE_ENTRY is the normal sub-area. However, since the value of the corresponding state entry STATE_ENTRY is 0x0 (or 0x0000), the corresponding sub-area has not yet been remapped to another bad memory area.

Referring to FIG. 11, in the case that a (K+2)th memory area MEM_AREA_K+2 becomes a runtime bad memory area, the state information on the (K+2)th memory area MEM_AREA_K+2 may be added to the bad memory area replacement table BAD_TBL.

In FIG. 11, the value of the state entry STATE_ENTRY corresponding to the first index IDX_1 of the (K+2)th memory area MEM_AREA_K+2 is 0x0 (or 0x0000). Accordingly, this indicates that in the (K+2)th memory area MEM_AREA_K+2, the sub-area corresponding to the first index IDX_1 of the corresponding state entry STATE_ENTRY is the normal sub-area.

On the other hand, the value of the state entry STATE_ENTRY corresponding to the third index IDX_3 of the (K+2)th memory area MEM_AREA_K+2 is 0xFFFF. Accordingly, this indicates that in the (K+2)th memory area MEM_AREA_K+2, the sub-area corresponding to the third index IDX_3 of the corresponding state entry STATE_ENTRY is the bad sub-area.

FIG. 12 is a diagram illustrating an exemplary operation for remapping the bad sub-area included in a target bad memory area added in FIG. 11.

In FIG. 12, it is assumed that the (K+2)th memory area MEM_AREA_K+2 is the target bad memory area.

The memory controller 120 of the memory system 100 may remap the bad sub-area included in the (K+2)th memory area MEM_AREA_K+2 as the target bad memory area to the normal sub-area included in the (K+1)th memory area MEM_AREA_K+1, which is one of the remaining memory areas other than the target bad memory area among the bad memory areas added to the bad memory area replacement table BAD_TBL.

In FIG. 12, only the case in which the bad sub-area included in the (K+2)th memory area MEM_AREA_K+2 is remapped to the normal sub-area included in the (K+1)th memory area MEM_AREA_K+1 is illustrated. However, it will be appreciated that the bad sub-area included in the (K+2)th memory area MEM_AREA_K+2 may be remapped to the normal sub-area included in the other memory areas, e.g., MEM_AREA_1, MEM_AREA_2, and MEM_AREA_K.

In FIG. 12, among the bad sub-areas included in the (K+2)th memory area MEM_AREA_K+2 as the bad memory area, the sub-area corresponding to the third index IDX_3 may be remapped to the normal sub-area corresponding to the third index IDX_3 among the normal sub-areas included in the (K+1)th memory area MEM_AREA_K+1.

In this case, the value of the state entry STATE_ENTRY corresponding to the third index IDX_3 of the (K+1)th memory area MEM_AREA_K+1 may be set to 0x01A1, which is the address of the (K+2)th memory area MEM_AREA_K+2.

In addition, the sub-area corresponding to the (N−1)th index IDX_N−1 among the bad sub-areas included in the (K+2)th memory area MEM_AREA_K+2, which is the bad memory area, may be remapped to the sub-area corresponding to the (N−1)th index IDX_N−1 among the normal sub-areas included in the (K+1)th memory area MEM_AREA_K+1.

In this case, the value of the state entry STATE_ENTRY corresponding to the (N−1)th sub-area SUB_AREA_N−1 of the (K+1)th memory area MEM_AREA_K+1 may be set to 0x01A1, which is the address of the (K+2)th memory area MEM_AREA_K+2.

FIG. 13 is a diagram illustrating an operation of deleting the state information of the target bad memory area for which remapping has been completed in FIG. 12 from the bad memory area replacement table BAD_TBL.

In the case that all bad sub-areas included in the target bad memory area are remapped to the normal sub-area included in another bad memory areas different from the target bad memory area, the memory controller 120 of the memory system 100 may delete the state information of the target bad memory area from the bad memory area replacement table BAD_TBL.

This is because all bad sub-areas included in the target bad memory area have been remapped to other normal sub-area, thereby it is possible to prevent the problem of accessing any bad sub-areas when accessing the target bad memory area.

In FIG. 13, the memory controller 120 of the memory system 100 may delete state information of the (K+2)th memory area MEM_AREA_K+2, which is the target bad memory area, from the bad memory area replacement table BAD_TBL. In this case, when accessing the K+2th memory area MEM_AREA_K+2, the memory controller 120 may determine which of the sub-areas among the sub-areas included in the (K+2)th memory area MEM_AREA_K+2 has been remapped to the normal sub-area of another bad memory area (e.g., bad memory area MEM_AREA_K+1), by using the state information of the bad memory area replacement table BAD_TBL.

Figure 14:
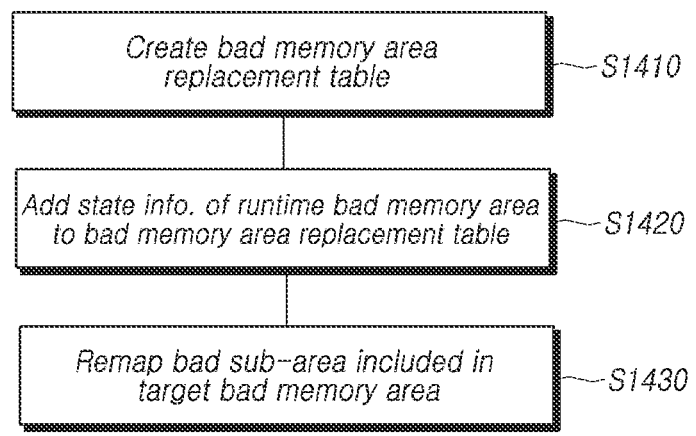
FIG. 14 is a diagram illustrating a method of operating a memory system according to an exemplary embodiment of the present disclosure.

FIG. 14 is a diagram illustrating a method of operating the memory system 100 according to an exemplary embodiment of the present disclosure.

As described above, the memory system 100 may include the memory device 110 having a plurality of memory areas MEM_AREA. In addition, each memory area MEM_AREA may include N (N is a natural number of 2 or more) sub-areas SUB_AREA. Each sub-area SUB_AREA may be a bad sub-area in which an unrecoverable defect has occurred or a normal sub-area in which no defect or recoverable defect has occurred.

Referring to FIG. 14, the method of operating the memory system 100 may include creating a bad memory area replacement table BAD_TBL including state information on a bad memory area, which is a memory area in which at least one (i.e., one or more) of the bad sub-areas has occurred, among the plurality of memory areas MEM_AREA included in the memory device 110 (S1410).

Further, the method of operating the memory system 100 may include adding, when at least one runtime bad memory area (e.g., runtime bad area MEM_AREA_K+1 in FIG. 10 or runtime bad areas MEM_AREA_K+1 and MEM_AREA_K+2 in FIG. 12) among the plurality of memory areas occurs, state information of the bad memory area occurred during runtime to the bad memory area replacement table BAD_TBL (S1420).

In addition, the method of operating the memory system 100 may include remapping, based on the bad memory area replacement table BAD_TBL, the bad sub-area included in a target memory area (e.g., MEM_AREA_K+2 in FIG. 12) among the runtime bad memory areas added to the bad memory area replacement table BAD_TBL to the normal sub-area included in one of remaining bad memory areas except for (excluding) the target bad memory area among the bad memory areas added to the bad memory area replacement table BAD_TBL (S1430).

In one embodiment, the memory device 110 may include a plurality of planes, each of the N sub-areas SUB_AREA may be located in a different plane among the plurality of planes.

In one embodiment, the bad memory area replacement table BAD_TBL may be created when the firmware for managing the bad memory area replacement table is updated.

The state information of the bad memory area included in the bad memory area replacement table BAD_TBL may include N state entries STATE_ENTRY, each of the N state entries STATE_ENTRY corresponding to one of the N sub-areas SUB_AREA included in the bad memory area. In this case, each of the N state entries STATE_ENTRY may indicate whether the sub-area corresponding to each state entry is the bad sub-area, or each of the N state entries STATE_ENTRY may include state information on the memory area in which the sub-area corresponding to each state entry is remapped.

In one embodiment, the state entry having the first value (e.g., 0xFFFF) among N state entries may indicate that the sub-area corresponding to the corresponding state entry is the bad sub-area.

In another embodiment, the state entry having the second value (different from the first value) among N state entries may indicate that there is no memory area to which the sub-area corresponding to the corresponding state entry is remapped.

The remapping the bad sub-area included in the target bad memory may include deleting the state information of the target bad memory area from the bad memory area replacement table BAD_TBL, when all bad sub-areas included in the target bad memory area have been remapped to the normal sub-area included in one of remaining bad memory areas other than the target bad memory area among the bad memory area added to the bad memory area replacement table BAD_TBL.

In some implementations, the operation of the memory controller 120 described above may be controlled by the control circuit 123, and may be performed in such a manner that the processor 124 executes (drives) firmware in which the overall operation of the memory controller 120 is programmed.

Figure 15:
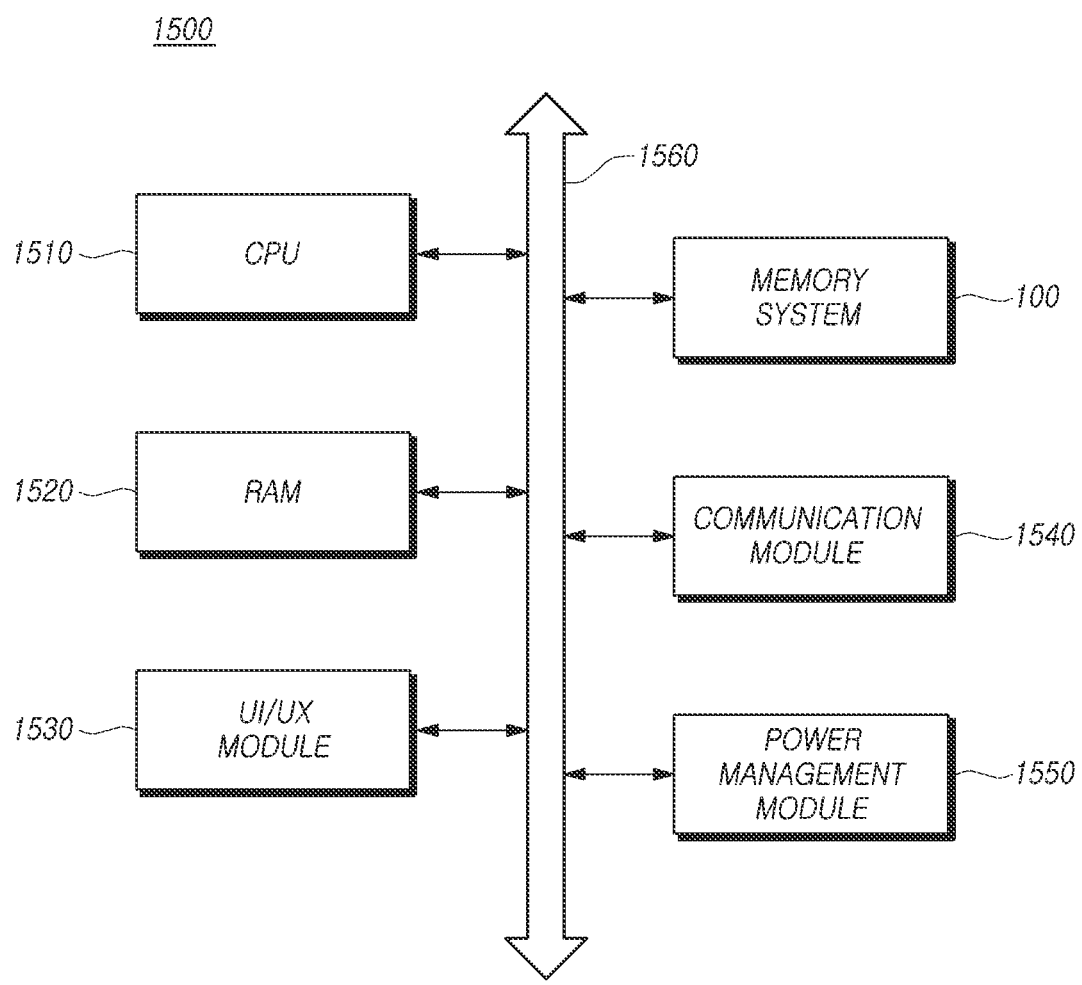
FIG. 15 is a diagram illustrating the configuration of a computing system according to an exemplary embodiment of the disclosed technology.

FIG. 15 is a diagram illustrating the configuration of a computing system 1500 according to an exemplary embodiment of the disclosed technology.

Referring to FIG. 15, the computing system 1500 based on an embodiment of the disclosed technology may include: a memory system 100 electrically connected to a system bus 1560; a CPU 1510 configured to control the overall operation of the computing system 1500; a RAM 1520 configured to store data and information associated with operations of the computing system 1500; a user interface/user experience (UI/UX) module 1530 configured to provide the user with a user environment; a communication module 1540 configured to communicate with an external device as a wired and/or wireless type; and a power management module 1550 configured to manage power used by the computing system 1500.

The computing system 1500 may be a personal computer (PC) or may be any one or more of a mobile terminal, such as a smartphone, a tablet or various electronic devices.

The computing system 1500 may further include a battery for supplying an operating voltage, and may further include an application chipset, a graphic-related module, a camera image processor, and a DRAM among other possible components.

The memory system 100 may include any combination of one or more devices configured to store data in, e.g., a magnetic disk such as a hard disk drive (HDD), a nonvolatile memory such as a solid state drive (SSD), a universal flash storage device, or an embedded MMC (eMMC) device. The non-volatile memory may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. In addition, the memory system 100 may be implemented as storage devices of various types and mounted inside various electronic devices.

According to exemplary embodiments of the disclosed technology described above, the operation delay time of the memory system may be advantageously reduced or minimized. In addition, according to embodiments of the present disclosure, overhead occurring in the process of calling a specific function may be advantageously reduced or minimized. Although various exemplary embodiments of the present disclosure have been described with particular specifics and varying details for illustrative purposes, those skilled in the art will appreciate that various alternatives, modifications, changes, additions and substitutions may be made without departing from the scope of the present disclosure as defined in the following claims.

What is claimed is:

1. A memory system comprising:
a memory device including a plurality of memory areas, each memory area comprising N sub-areas, N being a natural number greater than or equal to 2, each sub-area being one of a bad sub-area having an unrecoverable defects or a normal sub-area having no defect or recoverable defect; and a memory controller for communicating with the memory device and controlling the memory device;

wherein the memory controller is configured to:

create a bad memory area replacement table including state information on a bad memory area among the plurality of memory areas, the bad memory area comprising at least one bad sub-area, add, when at least one runtime bad memory area among the plurality of memory areas occur, state information on the at least one runtime bad memory area to the bad memory area replacement table; and remap, based on the bad memory area replacement table, a bad sub-area included in a target bad memory area among the at least one runtime bad memory area added to the bad memory area replacement table, to a normal sub-area included in one of remaining bad memory areas other than the target bad memory area among the plurality of bad memory areas added to the bad memory area replacement table.

2. The memory system of claim 1, wherein the memory device comprises a plurality of planes, each of the N sub-areas being located in a different plane among the plurality of planes.

3. The memory system of claim 1, wherein the memory controller is further configured to:

determine whether a firmware configured to manage the bad memory area replacement table has been updated; and create the bad memory area replacement table when the firmware has been updated.

4. The memory system of claim 1, wherein the state information of the bad memory area included in the bad memory area replacement table comprises N state entries, each of the N state entries corresponding to one of the N sub-areas included in the bad memory area, and each of the N state entries being configured to indicate (i) whether a sub-area corresponding to each state entry is a bad sub-area or (ii) information on a memory area to which a sub-area corresponding to each state entry is remapped.

5. The memory system of claim 4, wherein a state entry having a first value among the N state entries is configured to indicate that the sub-area corresponding to the corresponding state entry is the bad sub-area.

6. The memory system of claim 4, wherein a state entry having a second value among the N state entries indicates that there is no memory area to which the sub-area corresponding to the corresponding state entry is remapped.

7. The memory system of claim 1, wherein, when all bad sub-areas included in a target bad memory area are remapped to one of the normal sub-area included in one of remaining bad memory areas excluding the target bad memory area among the bad memory area added to the bad memory area replacement table, the memory controller is configured to delete the state information of the target bad memory area from the bad memory area replacement table.

8. A method of operating a memory system including a memory device having a plurality of memory areas, each memory area including N sub-areas, N being a natural number greater than or equal to 2, each sub-area being a bad sub-area having an unrecoverable defect or a normal sub-area having no defect or a recoverable defect, the method comprising:

creating a bad memory area replacement table including state information of a bad memory area among the plurality of memory areas, the bad memory area including at least one bad sub-area;

adding, when at least one runtime bad memory area among the plurality of memory areas occurs, state information of one or more runtime bad memory areas to the bad memory area replacement table; and remapping, based on the bad memory area replacement table, the bad sub-area included in a target memory area among the one or more runtime bad memory areas added to the bad memory area replacement table to a normal sub-area included in one of remaining bad memory areas except for the target bad memory area among a plurality of bad memory areas added to the bad memory area replacement table.

9. The method of claim 8, wherein the memory device comprises a plurality of planes, each of the N sub-areas being located in a different plane among the plurality of planes.

10. The method of claim 8, further comprising:

determining an update of a firmware configured to manage the bad memory area replacement table, wherein the bad memory area replacement table is created when the firmware has been updated.

11. The method of claim 8, wherein the state information of the bad memory area included in the bad memory area replacement table comprises N state entries, each of the N state entries corresponding to one of the N sub-areas included in the bad memory area, and each of the N state entries is configured to indicate whether a sub-area corresponding to each state entry is a bad sub-area or information on a memory area to which the sub-area corresponding to each state entry is remapped.

12. The method of claim 11, wherein a state entry having a first value among the N state entries is configured to indicate that the sub-area corresponding to the corresponding state entry is the bad sub-area.

13. The method of claim 11, wherein a state entry having a second value among the N state entries is configured to indicate that there is no memory area to which the sub-area corresponding to the corresponding state entry is remapped.

14. The method of claim 8, wherein remapping the bad sub-area included in a target memory area comprises, when all bad sub-areas included in the target bad memory area are remapped to one of the normal sub-area included in one of remaining bad memory areas excluding the target bad memory area among the bad memory area added to the bad memory area replacement table, deleting the state information of the target bad memory area from the bad memory area replacement table.

15. A method of creating a bad memory area replacement table in a memory system comprising a memory device and a memory controller, the memory device comprising a plurality of memory areas, each memory area comprising N sub-areas, N being a natural number greater than or equal to 2, each sub-area being a bad sub-area having an unrecoverable defect or a normal sub-area having no defect or a recoverable defect, the method comprising steps of:

checking, by the memory controller, a firmware configured to manage the bad memory area replacement table;

determining whether the firmware has been updated;

in the event that the firmware has been updated:
creating the bad memory area replacement table; and in the event that the firmware has not been updated:

returning back to determining whether the firmware has been updated, wherein the bad memory area replacement table comprises state information on a bad memory area among the plurality of memory areas.

16. The method of claim 15, further comprising, when one or more runtime bad memory areas among the plurality of memory areas occur:

adding state information on the on the one or more runtime bad memory areas to the bad memory area replacement table; and remapping a bad sub-area included in a target bad memory area among the one or more runtime bad memory areas added to the bad memory area replacement table to a normal sub-area included in one of remaining bad memory areas except for the target bad memory area among a plurality of bad memory areas added to the bad memory area replacement table.

17. The method of claim 16, wherein the state information comprises N state entries, each one of the N state entries being associated with one of the N sub-areas.

18. The method of claim 17, wherein a state entry comprises information indicating whether a corresponding sub-area is a bad sub-area or a normal sub-area.

19. The method of claim 17, wherein remapping the bad sub-area included in the target bad memory area comprises:

setting a value of a state entry in the one of remaining bad memory areas corresponding to a state entry of the target bad memory area to an address of the target bad memory area.

20. The method of claim 15, wherein determining whether the firmware has been updated comprises:

checking a flag indicating whether to update the firmware or whether a version of the firmware is changed during a boot-up of the memory system.

* * * * *